United States Patent [19]

Weber et al.

[11] 4,028,682

[45] June 7, 1977

[54] CIRCUIT ARRANGEMENT FOR SELECTING THE FUNCTION OF CONNECTION CONTACTS ON CIRCUIT CHIPS

[75] Inventors: Gerald Weber; Jürgen Sorgenfrei, both of Braunschweig, Germany

[73] Assignee: Olympia Werke AG, Wilhelmshaven, Germany

[22] Filed: Dec. 20, 1974

[21] Appl. No.: 535,090

[30] Foreign Application Priority Data

Dec. 22, 1973 Germany .......................... 2364253

[52] U.S. Cl. ............................................ 340/172.5

[51] Int. Cl.² ........................ G06F 3/00; G06F 9/00

[58] Field of Search ...... 340/172.5, 173 R, 173 SP; 307/213, 238, 242, 303

[56] References Cited

UNITED STATES PATENTS

| | | | |
|---|---|---|---|
| 3,462,742 | 8/1969 | Miiller et al. | 340/172.5 |
| 3,582,902 | 6/1971 | Hirtle et al. | 340/172.5 |
| 3,646,522 | 2/1972 | Furman et al. | 340/172.5 |
| 3,651,472 | 3/1972 | Holtey | 340/172.5 |
| 3,691,538 | 9/1972 | Haney et al. | 340/173 SP |
| 3,702,988 | 11/1972 | Haney et al. | 340/172.5 |
| 3,757,306 | 9/1973 | Boone | 340/172.5 |
| 3,758,761 | 9/1973 | Henrion | 340/172.5 X |
| 3,821,715 | 6/1974 | Hoff, Jr. et al. | 340/172.5 |
| 3,855,577 | 12/1974 | Vandierendonck | 340/172.5 |
| 3,938,098 | 2/1976 | Garlic | 340/172.5 |
| 3,939,452 | 2/1976 | Faggian | 340/172.5 |

OTHER PUBLICATIONS

"Intel MCS-4 Micro Computer Set," Intel Corp., Jan. 1972, pp. 1-12.

Wickes, William E., "A Compatible MOS/LSI Microprocessor Device Family" in Computer Design, July 1973, pp. 75-81.

*Primary Examiner*—Melvin B. Chapnick

*Attorney, Agent, or Firm*—Spencer & Kaye

[57] ABSTRACT

In a circuit arrangement composed of highly integrated chips for a microprogrammed data processing device of the type including an arithmetic and control unit, at least one read-only memory, at least one random access memory, connecting contacts on the chips for connection to peripheral units, and a bus connecting the chips together, each contact is connected to a function selecting unit whose operating state is controlled by a microprogram contained in the read-only memory to selectively connect the contact in the arrangement as either an input contact or an output contact. The function selecting unit includes for each contact a bistable circuit and a gating circuit controlled by the microprogram to determine when each contact constitutes an input or an output terminal.

3 Claims, 4 Drawing Figures

SUPPLY LINES
DATA BUS
ADDRESS BUS
CONTROL BUS
4
5
6
7
8
9
10
11
12
13
14
15
ARITHMETIC
+ CONTROL
(UNIT)
1
READ-ONLY
(MEMORY)
2
RANDOM ACCESS
(MEMORY)
3
16
17
18
19
KEYBOARD
20
PRINTER
21

CLOCK PULSE INPUT
SETTING INPUT
25
26
27
DATA INPUT
BISTABLE CIRCUIT
24
AND GATE
33
30
32
31
28
OUTPUT DRIVER
22
29
23
CONNECTING CONTACT
CHIP

CIRCUIT ARRANGEMENT FOR SELECTING THE FUNCTION OF CONNECTION CONTACTS ON CIRCUIT CHIPS

BACKGROUND OF THE INVENTION

The present invention relates to a circuit arrangement of highly integrated chips, particularly of the type produced according to the MOS technique, for microprogrammed data processing devices including an arithmetic and control unit (RSE), one or a plurality of read-only memories (ROM's), one or a plurality of random access memories (RAM's), and connecting contacts for peripheral units as well as a bus connecting the chips together.

When circuit arrangements are constituted by chips, there arises the necessity of providing connecting contacts in the numbers required for connecting further circuit components, for example further chips and peripheral devices. Since the small surface area of the chips is to be utilized as much as possible for the circuit arrangements themselves, so that little space remains for the conductor channels connected to the connecting contacts, and since only a limited number of connecting contacts can be accommodated on the relatively very small chips, there exist considerable difficulties in producing the required number of connecting contacts.

In the prior art, circuit components such as, for example, ROM's or RAM's are arranged on chips and the attainable number of connecting contacts is divided among a collecting line, or bus, in the case of modular design, peripheral output contacts, e.g., to printers or indicator devices, and peripheral input contacts, e.g., from a keyboard. If such chips were intended to be used for different types of circuit arrangements, it would inevitably occur that at one time there would be too many inputs provided by the peripheral contacts while the number of outputs would be sufficient, and at another time the reverse would be the case.

Thus, every time a circuit arrangement of the above-mentioned type was designed for a different use there arose the problem of how to utilize the chips and accomplish the intended task with the small number of connecting contacts.

SUMMARY OF THE INVENTION

It is an object of the present invention to increase the flexibility of utilization of such chips without increasing the number of connecting contacts.

This and other objects are accomplished, in summary, by associating the connecting contacts with the one or more ROM's and storing in the ROM's a microprogram which indicates which contacts are to be input contacts and which are to be output contacts.

The solution according to the present invention results in the advantage that the full number of connecting contacts is available to be used as desired when designing a circuit arrangement for a new application, so that they can be used as inputs or outputs as required. For each case of application a known masking process is used to write into the ROM a microprogram which is specifically applicable for the particular device being constructed and for the particular application so that with this microprogram the input and output channels are assigned as well as the connecting contacts connected therewith. Thus no modifications need be made in the structure of the chips.

Advantageous embodiments of the present invention will become evident from the description that follows.

One embodiment of the present invention is illustrated in the drawings and will be explained in detail below.

DESCRIPTION OF THE PREFERRED EMBODIMENTS

Figure 1:
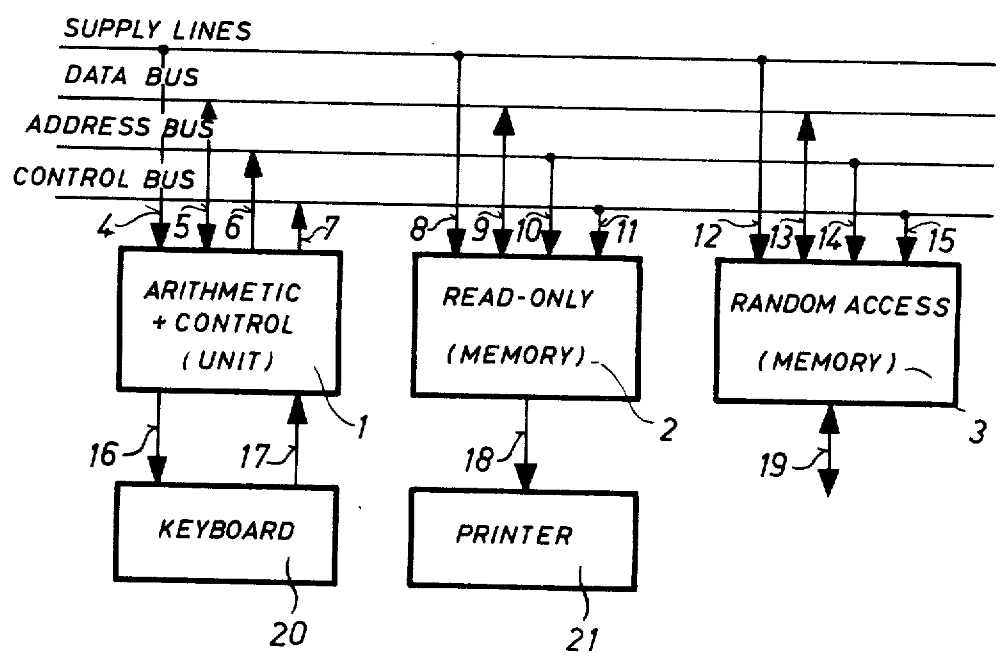
FIG. 1 is a block diagram of a circuit arrangement of highly integrated chips.

In order to illustrate the range of application of the invention, FIG. 1 shows a block circuit diagram for the circuit arrangement of a common table-model calculator. A collecting cable which includes a control bus, an address bus, a data bus, and supply lines is connected to three IC chips. Each bus consists of a plurality of lines which are required for conducting the signals containing data, addresses and control instructions, respectively. The supply lines supply the chips with the necessary operating voltages, signals for the starting states and a system clock pulse train.

The first chip 1 includes an arithmetic and control unit (RSE) which contains, for example, the controls for the entire circuit arrangement as well as an arithmetic logic. The arithmetic logic may operate arithmetically and logically and may perform transfer functions to link the components in the RSE as well as transfer functions for the exchange of information between the RSE and the further chips through the lines of the collecting cable. With these operations it is possible to perform any desired arithmetic processes, to transmit data or control signals to other chips or peripheral devices, or to receive data or signals therefrom, to make logic decisions, and to write data into or read data out of supplemental memories.

The second chip 2 includes, in addition to the circuit arrangements required for cooperation with RSE chip 1, a read-only memory (ROM) in which the microprogram for the operation of the device is stored by means of a known masking process. The microprogram constitutes a series of elementary instructions which are required in order to realize — in the case of the table-model calculator embodiment — basic arithmetic functions, keyboard input, printer output, etc.

The third chip 3, finally, includes as its most significant part, a random access memory (RAM). All arithmetic operations are effected between the RAM chip and the RSE chip. Here data can be written in or read out via the collecting cable.

The directional arrows of the connections 4–15 between the collecting cable and the chips show that the control of the ROM chip 2 as well as of the RAM chip 3 and the addressing are effected from within the RSE chip 1, that data can be transported in both directions, and that the chips are supplied by a voltage source and a clock pulse generator which are not shown.

The chips 1, 2 and 3 are provided with peripheral connection zones 16, 17, 18 and 19. Each one of these zones includes a plurality of lines through which bit signals can be written in or read out in parallel. A keyboard 20 is connected to RSE chip 1 via the output zone 16 and the input zone 17. Signals which are transmitted to the keyboard through lines 16 are fed to the circuit arrangement through the lines of input zone 17 in dependence on the respective keys that were actuated.

A printer 21 is connected to the output zone 18 of the ROM chip 2 to print out the values to be calculated, subtotal values and the final totals. The RAM chip 3 is also provided with a peripheral zone 19 which in the embodiment of FIG. 1 is not used. Here a further peripheral unit could be connected which might be required for the operation of the device, for example, a magnetic tape cassette or a further external memory into which data are written and from which data are read out. The peripheral zone 19 could also be used for connection to one of the two already provided peripheral devices, i.e. keyboard 20 or printer 21, if the zones 16, 17 and 18 are not sufficient for proper connection.

Figure 2:
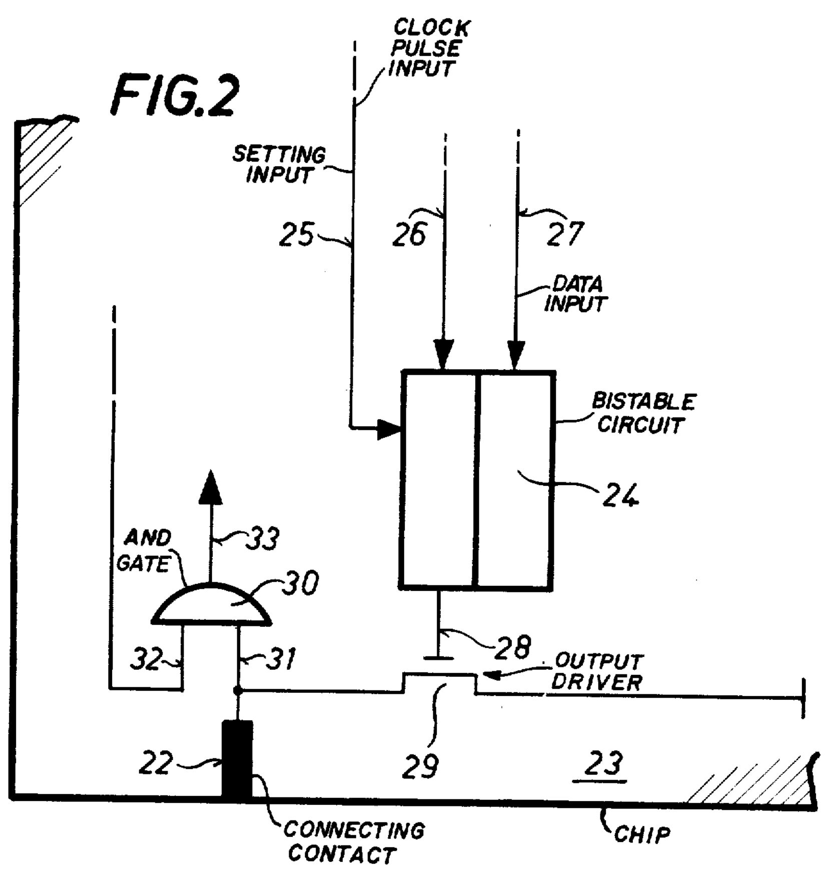
FIG. 2 is a basic circuit diagram of an input or output contact in arrangements according to the invention.

FIG. 2 shows details of one connecting contact of a peripheral connection zone of an arbitarily selected chip 23. The chip 23 is provided with one respective connecting contact 22 for each line of its peripheral connection zone. For each connecting contact 22, there is formed on the chip a bistable circuit 24 having three inputs 25, 26, 27 and one output 28.

If data bits are to be read out via connecting contact 22, i.e. if the connecting contact is designated in the manner of the present invention as an output by the associated microprogram, then the data which were processed in the RSE chip, for example, are fed to the data input 27 of the bistable circuit 24. The connecting contact 22 defined by the microprogram as an output is addressed by the RSE chip as indicated by the microprogram so that the data to be read out are conducted to the respective data input 27. Input 26 receives a clock pulse so that the data bits are read out in proper synchronism from the bistable circuit 24 via output 28. Input 25 is provided to set the bistable circuit 24 to a defined starting state.

The output signals from the bistable circuit 24 are fed via an output driver 29, in MOS chips preferably a field effect transistor, to the connecting contact 22 and can be transmitted from there to the peripheral units.

If, however, the connecting contact 22 is defined by the microprogram as an input, the bistable circuit 24 is first reset so that no output signal can reach contact 22 to produce a false input. An externally generated signal which is applied to connecting contact 22 via a conductor connected thereto (not shown) to be fed into the circuit arrangement is supplied to one input 31 of a gating circuit constituted by a conjunction (AND) unit 30 while the second input 32 is connected to receive a signal determined by the microprogram for designating contact 22 as an input contact. The output 33 of the conjunction unit 30 then contains the signal which is to be fed into the circuit arrangement.

This circuit offers the additional possibility of effecting an internal interrogation. For this purpose, data bits are fed from the bistable circuit 24 via driver 29 to the first input 31 of the conjunction unit 30 and a gating signal is applied to the second input 32 by the microprogram. An output signal, for example for control purposes, is then furnished to the circuit arrangement through the output 33 of the conjunction unit 30.

It can be seen that in the above-described manner the microprogram of a circuit arrangement can determine in all associated chips whether the given limited number of connecting contacts is to be utilized for output or input purposes or for an internal interrogation.

Figure 3:
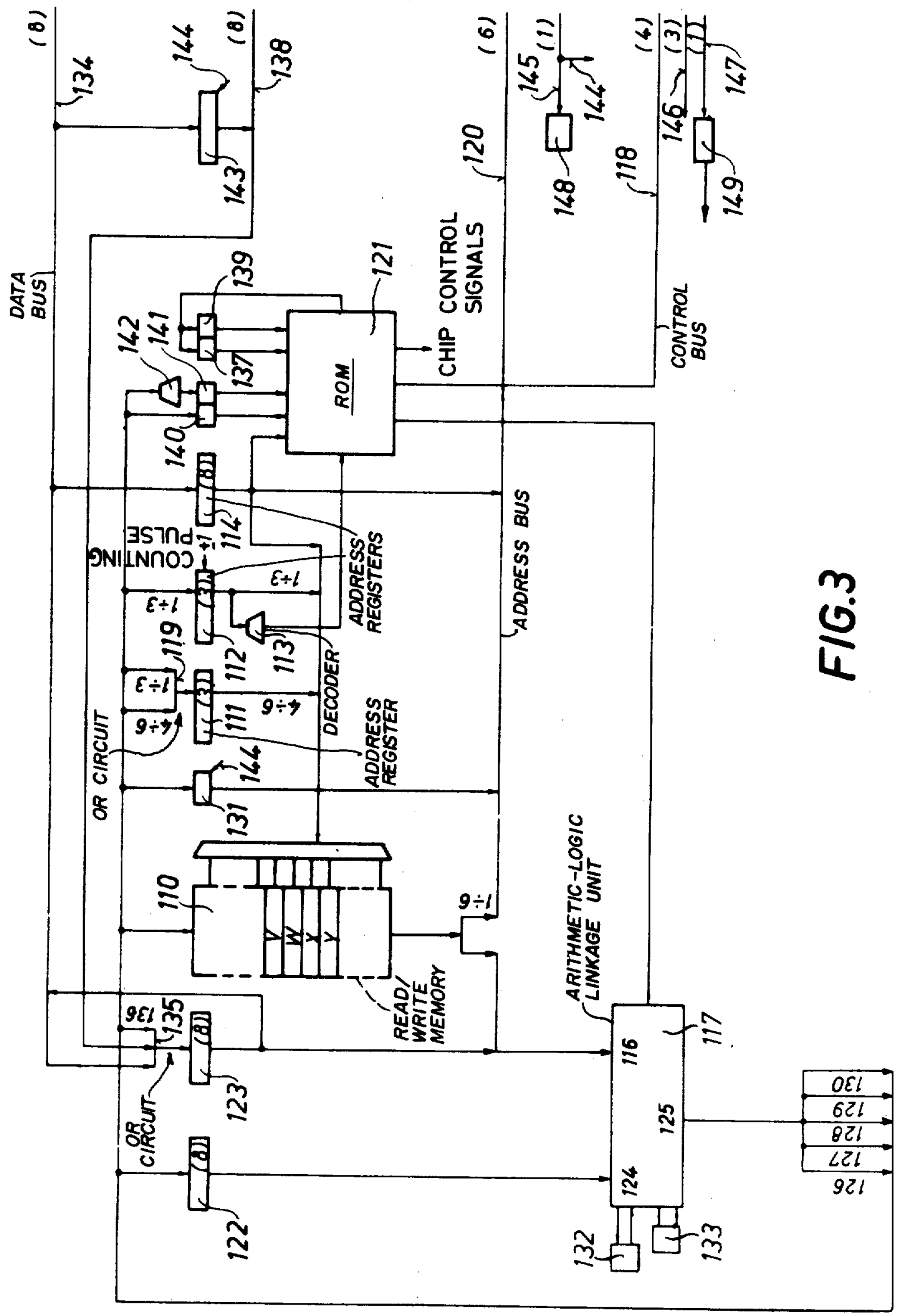
FIG. 3 is a block circuit diagram of one embodiment of the RSE chip 1 of FIG. 1.
Figure 4:
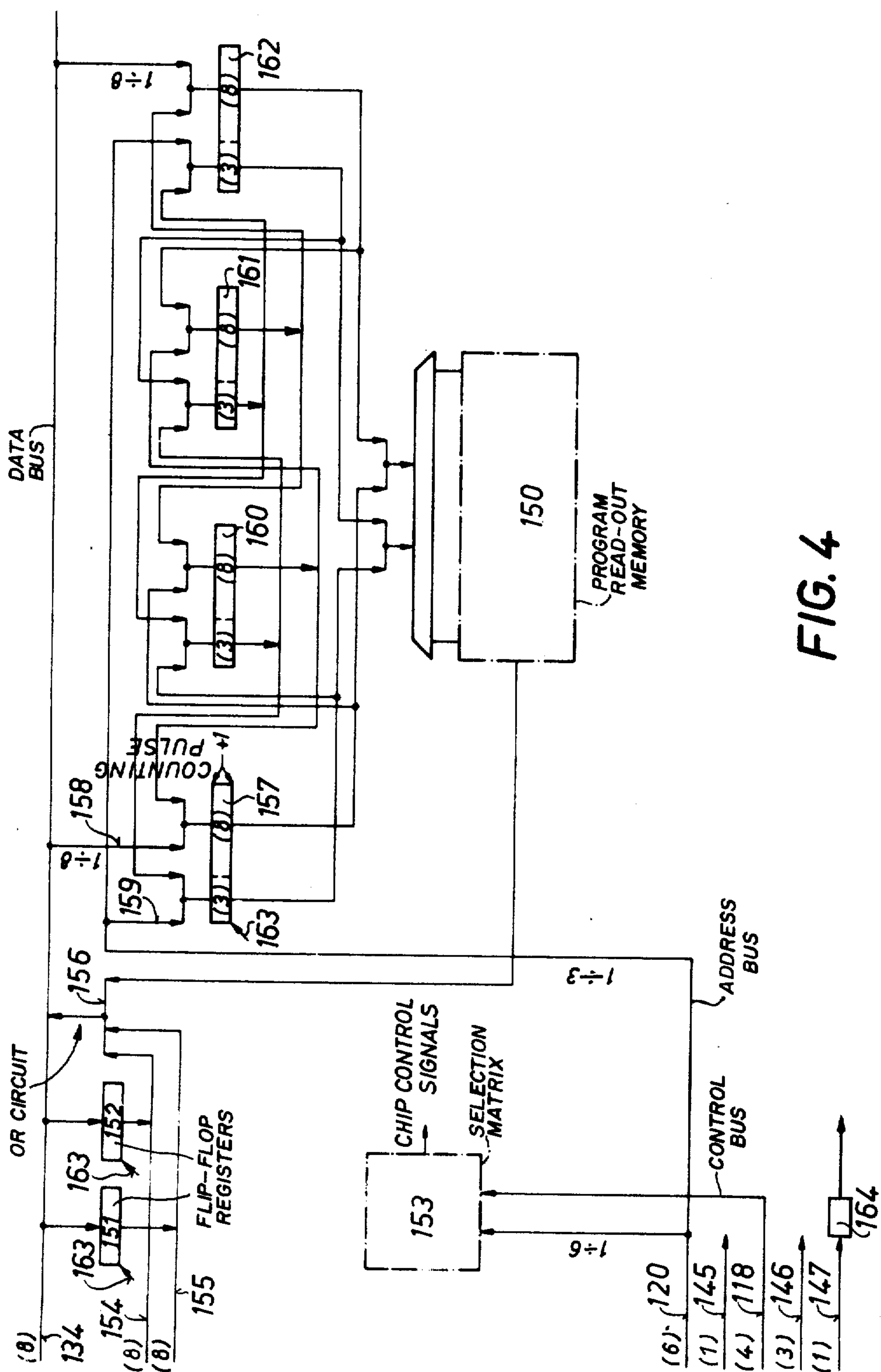
FIG. 4 is a block circuit diagram of one embodiment of the ROM chip 2 of FIG. 1.

In order to explain the controls effectuated at the connecting contact, e.g. contact 22 in FIG. 2, from a microproprogram, FIGS. 3 and 4 illustrate the structure and function of one embodiment of the RSE chip of FIG. 1 and one embodiment of the ROM, or PSE, chip 2 of FIG. 1. The circuit arrangement shown in FIG. 1 has a modular structure, i.e. a collecting bus begins at the RSE unit to which a larger number of modules can be connected. This number is limited only by the available addresses.

Each one of these modules may be an ROM module, an RAM module or a peripheral module. Dependent on the number of modules involved, a more or less large number of chips can be connected to the collecting bus. Thus the RSE chip shown as an example in FIG. 3 is provided with, in addition to all the other groups of modules, a peripheral module having a capacity of 8 bits, while the PSE chip shown in FIG. 4 has four ROM modules each with a capacity of 256 × 8 bits and two peripheral modules each with a capacity of 8 bits.

Any type of data transmission in the modular arrangement of FIG. 1 is under the control of the RSE unit which carries out its control functions via the control bus. Therefore, the RSE unit shown in FIG. 3 will be described first.

The RSE unit of FIG. 3 is provided with a read/write memory 110 which in this embodiment is designed so that 48 words containing 8 bits each can be stored therein. The storage locations for the words are called cells. Several cells of the memory are identified in the block circuit diagram with the reference letters V, W, X and Y.

In order to address one of the maximum of 48 memory cells, a six-digit binary address is required. This binary address is furnished by address registers 111 and 112. Register 111 stores the three highest-valued address bits, while register 112 stores the three lowest-valued address bits. Registers 111 and 112 are flip-flop registers and each includes three flip-flops as indicated by the numbers in parentheses in the address registers 111 and 112 in FIG. 3. The data paths from the address registers 111 and 112 to the read/write memory 110 are identified as 4 ÷ 6 and 1 ÷ 3, respectively, corresponding to the binary value of the address of read/write memory 110. The binary contents of the address registers 111 and 112 can be changed by the running program. The address registers 111 and 112 are thus suited for the indirect addressing of the memory cells.

Address register 112 is a three-stage binary counter and permits the sequential addressing of a data field.

A decoder 113 furnishes a control signal to ROM 121 of the instruction control if address register 112 has a binary content equal to 7. This makes it possible to interrogate, with a defined jump order, the end of a data field. The bits 1 ÷ 4 of an instruction register 114 form a second address path to the read/write memory 110 for explicit addressing of some memory cells. A selected memory cell is read out and reaches the operand input 116 of an arithmetic-logic linkage unit 117. The results formed in the arithmetic-logic linkage unit 117 can also be written back into the read/write memory 110 via eight lines of the data path 128 or can reach address registers 111 or 112 as new addresses.

The legend 1 ÷ 3 ahead of the address register 112 indicates that the first, second and third bits, or bits 1, 2, and 3, of output 125 of the arithmetic-logic linkage unit 117 are transferred. An OR circuit 119 is indicated in front of address register 111. Either the bits 1 ÷ 3 of output 125 of the arithmetic-logic linkage unit 117 or the bits 4 ÷ 6 are transferred to the address register 111.

The arithmetic portion of the unit RSE includes the arithmetic-logic linkage unit 117 in which the actual arithmetic functions are performed and the two buffer registers 122 and 123, which are arranged to act as operand registers. These are eight-digit flip-flop registers, indicated by the numeral 8 in parentheses. The arithmetic-logic linkage unit 117 links two operands which are present at inputs 116 and 124. Their output 125 is connected to a shifting mechanism, here represented by five different parallel data paths 126 to 130, the path 128 forming the RSE internal result bus. Results formed in this manner can be transferred selectively either to the operand registers 122, 123 or to the read/write memory 110 or, if they are addresses, to the address registers 111, 112 or 131.

The operand input 124 of the arithmetic-logic linkage unit 117 is principally fed by the accumulator formed by the operand register 122. The feeding of operands to the operand input 116 is effected selectively from the buffer register represented by operand register 123 or from the read/write memory 110. The type of linkage to be effected between the two operands 116 and 124 is determined by the instruction presently being followed and stored in the instruction register 114. The contents of instruction register 114 are fed for this purpose to ROM 121 of the instruction control which produces therefrom the required control signals for the arithmetic-logic linkage unit 117.

Both flip-flop registers 132 and 133 store the occurring binary transfers and control the correction addition in decimal operations. Register 132 simultaneously forms the input transfer for the next data byte to be linked in the case of processing of a whole field, i.e. processing with sequential access to the individual bytes. The term "byte" means a group of bits, forming together a data word. The contents of a flip-flop register 132 can be checked by a conditioned jump order.

The buffer register 123 serves as an intermediate store in the transmission of data between the RSE chip and an external chip with a ROM, RAM or peripheral module. Data to be transferred into the RSE unit travel through the data bus 134 and the OR circuit 135 in front of the buffer register 123 to the buffer register 123, while data to be emitted by the RSE unit travel from the buffer register 123 through the data bus 134 to the modules on external chips. The right-hand data path 136 of the OR circuit 135 feeds the buffer register 123 with all data to be emitted. The peripheral channel 138 of the RSE unit opens into the center data path of the OR circuit. Peripheral data to be fed in through this channel come to the buffer register and from there via the arithmetic-logic linkage unit 117 to the accumulator 122 of the system.

A condition flip-flop 140 is set if a linkage result contains a zero in bit 8 which is the same as a positive number in binary representation in the scale-of-two complement. A second condition flip-flop 141 is set if the linkage result equals zero. The decoder 142 required for this purpose is indicated at the input of the condition flip-flops 141.

The control mechanism addresses, via address bus lines 120, the module of external chips which is to effect an exchange of data with the RSE. The instructions required for this purpose are furnished by the instruction to be followed, which is presently in instruction register 114. ROM 121 of the instruction control decodes the binary contents of instruction register 114 for this purpose and produces therefrom all the required control signals.

There are two groups of control signals: the RSE internal control values; and the signals for controlling the functions of external chips, and these four control signals are fed to these chips via control bus 118. Briefly speaking, the control mechanism controls the alternating read-out and performance of the instructions. To read out an instruction, the contents of the three-bit flip-flop register 131 are switched to three address bus lines 120. The detailed procedure of selecting an instruction word in the PSE chip will be described in conjunction with the description of the PSE block circuit diagram.

The active PSE module transfers the selected instruction over data bus 134 into the instruction register 114 and into the buffer register 123 of the RSE unit. Thus the instruction reading cycle is completed and processing of the instruction begins. The operands required for this purpose in most cases are present in the accumulator 122 and in the read/write memory 110 of the RSE unit and thus permit the instructions to be internally processed in the RSE unit. The data bus 134 remains unused in this case so that the next instruction can be read in parallel with the processing of the current instruction.

The selection of peripheral data is effected by different addresses at the address bus 120. A maximum of 64 peripheral channels on external chips can be addressed. Two types of addressing can be used in this case.

In the first type, the so-called direct module addressing, the bits 1–3 of the instruction register 112 are switched to bits 1–3 of the address bus 120. Bits 4, 5 and 6 are automatically set to 1. This shows that, depending on the binary value, only module addresses between 56 and 63 can be addressed.

The second type of addressing, the so-called indirect addressing of RAM or peripheral modules on external chips in the range between 0 and 63, is effected from some data cells of the read/write memory 110. Bits 1–6 of these data cells are switched to the address bus 120 for this purpose. An instruction operating with external data is processed in several machine cycles. The control mechanism employs cycle counters 137 and 139 for this purpose.

The RSE unit has a peripheral channel 138 for feeding in or reading out 8 data bits. In order to read out the data bits, the contents of the accumulator 122 are brought through the arithmetic-logic linkage unit 117 into the buffer register 123, before it is transferred via data bus 134 into a read-out register 143.

The peripheral outputs are bistable and remain in the preset state until new information is transferred to the output register 143.

When the system is switched on, the output register 143 is automatically set to zero by a "start" signal, indicated by the arrow 144. It is thus assured that when the system is switched on, connected peripheral units will not inadvertently start functioning. The start signal will be explained in detail below. The flip-flop positions of the output register 143 can be interrogated at any time via the input path 138 to the buffer register 123.

The points of interconnection for the RSE unit can be seen at the right edge of FIG. 3. The numeral indications in parentheses refer to the number of contacts associated with the respective illustrated interconnection point. The system points of interconnection which are common to all chips, the so-called module bus, includes the eight contacts of the data bus 134 the six contacts of the address bus 120, the four contacts of the control bus 118, the start signal 145 contact, the three operating voltage contacts 146 and the one system clock pulse contact 147. This brings the total number of contact terminals in the module bus to 23.

The data bus 134 is designed to be bidirectional, i.e. the transfer of data is possible in both directions. The data (bytes) are transferred serially, while the bits of a byte are transferred in parallel. The address bus 120 serves the RSE unit to select the module on other chips with which data are to be exchanged via data bus 134. The required control instruction for the selected module, i.e. the directions of transfer, selection of register and type of data to be transferred (characters, instructions, addresses) are furnished by the RSE unit via the control bus 118.

The start signal 144, when the system is switched on, constitutes the defined program start at the instruction address 0. Once the voltage supply has reached its minimum operating values, a synchronization flip-flop 148 is set and starts the program sequence. The start signal 144 also erases the RSE address register 131 as well as the address registers of all external chips. With this measure the start of the program is assured at the instruction address 0.

In order to provide a time sequence control, the chips require the system clock pulse. The system clock pulse acts in every chip on a two-stage binary counter 149 from which four counting states can be decoded. The four counting states form the so-called machine cycle. The performance of an instruction requires one or up to a maximum of four machine cycles.

FIG. 4 is a block circuit diagram of one embodiment of the program storage unit (PSE) 2 of FIG. 1. Such a PSE chip includes a program read-out memory 150, which in the present example is assumed to have a capacity of 1024 bytes of 8 bits each. The read-out memory 150 serves to store microinstructions, macroinstructions and unvarying data (e.g., numbers, text symbols, addresses, code tables). This read-out memory 150 is divided, regarding its addresses, into four modules with 256 bytes each.

The PSE unit also includes two peripheral modules 151 and 152, constituted by flip-flop registers. The user assigns a six-digit binary address between 0 and 63 to each one of the six modules contained in units 150, 151 and 152. The selection is effected in a selection matrix 153 which is stored together with the actual user program by mask programming. The RSE unit selects a module by transmitting the six-digit module address over address bus 120. In the selection matrix 153 of the PSE unit this address is compared with the module address provided by the user and upon coincidence of addresses the corresponding module is activated. The signals which are also transmitted from the RSE unit over the control bus 118 inform the activated module which functions are to be performed. They also effect the generation of the corresponding chip control values. Flip-flop register 151 corresponds to peripheral channel 1 and flip-flop register 152 corresponds to peripheral channel 2 of the PSE unit.

If peripheral data are to be emitted, the RSE unit transfers these data through data bus 134 into the active discharge register 151 or 152, respectively. These data are now present at the peripheral terminals 154 and 155 until the contents of discharge register 151 or 152, respectively, have been changed by the transmission of new information. In order to peripherally put in data the information present at the peripheral contacts 154, 155 is fed through OR circuit 156 (to the right of register 152) to data bus 134 and through it to the RSE unit.

The memory cells of the read-out memory 150 are addressed according to the addressing scheme. There exists the possibility of addressing up to 64 memory modules through the six lines of the address bus 120. The selection of the bytes in a memory module is effected by an eleven-digit address register 157 associated with the memory module. Bits 1–8 address the bytes within one memory module. The module itself is selected by bits 9 and 10. Thus the selection of the proper instruction has been effected within a PSE chip. Regarding programming techniques it is advantageous, however, to define the page sizes of 2048 bytes. This corresponds to the capacity of two physical PSE chips. Within these pages it is possible to have a linear program sequence and with an 11-bit jump address every byte can be addressed.

The selection of which one of the two PSE chips becomes active is made by bit 11 of address register 157. The selection of one of a plurality of regions is effected by the RSE unit via the address bus 120, lines 4 to 6.

There now follows a description of the PSE functions during the performance of a jump instruction, i.e. branching to any desired instruction address within a module region. The performance of a linear program is effected by sequential addressing of the individual instructions. For this purpose the address contents of the register 157 are continuously increased by 1. The address register 157 performs the function of an eleven-digit binary counter. If a byte with such an address contains a jump instruction, the linear program sequence is interrupted and the jump address contained in the instruction is transferred to address register 157.

The performance of an instruction requires three machine cycles. In the first cycle the first half of the instruction is transferred through OR circuit 156 and data bus 134 to the instruction register 114 of the RSE unit. This first half of the instruction contains in its bits 1–3 the upper three bits of the jump address. In the second machine cycle the second half of the instruction of the jump instruction is transferred to buffer register 123 of the RSE unit in the same manner. During the third machine cycle, bits 1–8 of the jump address are transferred from buffer register 123 via data bus 134 to the lower eight digits of register 157 of the PSE unit. In parallel therewith the three highest-valued bits are transferred from instruction register 114 of the RSE unit via the address bus 120, lines 1 to 3. Two PSE chips, belonging to one 2k module region, store this address in their address registers 157. The selection of one from a plurality of module regions, i.e. one of a plurality of pages of 2048 bytes, is effected via address bus 120, lines 4 to 6. In FIG. 4 the data paths 158 for the lower bits $1 \div 8$ and the data paths 159 for the upper bits $9 \div 11$ are shown separately. The number of bits (corresponding to the number of lines) is given in parentheses. The number (8) in address register 157 represents the eight bits of the address for selection of a byte in the selected memory module. The parenthetical indication (3) in the address register 157 represents the binary addresses 9–11 for selecting a memory module of a module region.

Registers 160, 161 and 162 are also eleven-digit flip-flop registers and together with register 157 form the so-called address stack, or return address register. The address stack serves to receive the return addresses in the case of subprogram jumps. If the running program (which is addressed by register 157) is a subprogram, register 160 receives the interruption addresses of the higher-level program, increased by 1. If the interrupted program was also a subprogram, register 161 receives the interruption address of the next-higher program level, etc. The corresponding data paths can be found in the block circuit diagram.

Upon completion of the subprogram, return to the interrupted, higher-level program is effected by a shift in the stack in the opposite direction.

A second addressing path exists for program read-out memory 150 via address register 162. It is shown on the right side of FIG. 4. Register 162 can be loaded directly from data bus 134, and via lines 1 ÷ 3 of address bus 120, with an 11-digit address. Register 162 is used to address constant data which may be disposed in the same program read-out memory 150 as the controlling program which is addressed by register 157. The reading out of unvarying data is effected over the same path as the reading out of instructions.

The points of interconnection of the PSE unit can be seen at the left margin of FIG. 4. The numerical indications in parentheses relate also to the number of contacts of the respective partial points of interconnection. Thus there are — as for the RSE unit — eight contacts for the data bus 134, six contacts for the address bus 120, four contacts for the control bus 118, one contact 145 for the start signal 144, three contacts for the operating voltages 146 and one contact for the system clock pulse 147. In the PSE unit the start signal 144 sets the address register 157 as well as the discharge registers 151, 152 to address 0 at the start of the program, which is indicated by the arrows 163. In this PSE unit the system clock pulse 147 also acts on a two-stage binary counter 164 from which can be decoded four counting states which form the machine cycle.

The functions of the peripheral channels, as well as their data paths and their arrangement in the total system, have been described with reference to FIGS. 3 and 4. The flip-flop 24 shown in FIG. 2 is a part of the read-out registers 143 of FIG. 3, and 151 and 152 of FIG. 4. The data path 27 of FIG. 2 is the input from data bus 134, signal 25 in FIG. 2 corresponds to the starting state signal 144 or 163, respectively, for setting the registers to zero, signal 26 in FIG. 2 is the transfer clock pulse which is derived from the machine clock pulse upon instruction from the RSE unit via the lines of the control bus 118, discussed further below, and signal 33 is the input path for a bit into the OR circuit 135 or 156, respectively. The transfer clock pulse 26 is generated subsequent to the transmission of the peripheral data at the beginning of the next machine cycle. The control instructions are transferred as usual to the control bus 118.

There now follows a description of the instruction sequences for the transmission of data. The MOS drivers 29 of FIG. 2, which are controlled by read-out registers 143, or 151 and 152, respectively, in conjunction with the peripheral contacts 22 form an OR circuit.

The input 31 to conjunction 30 is 0 V if either the MOS driver is switched through, i.e. flip-flop 24 contains a 1, or if the potential of 0 V is provided via contact 22. When the system is switched on, the starting state signal 25 assures that all read-out register flip-flops 24 are in the zero position. The OR circuit formed by the junction of the output of driver 29 and contact 22 is thus fed only by the input contact. If the peripheral contacts are to operate as input contacts, it is only necessary to have a programmed input instruction which, upon being carried out, activates signal 32 and thus switches the potential across contact 22 through to output 33 and transfers it to the accumulator 122 of the RSE unit. The thus transmitted data can be intermediately stored in the RSE-RAM unit 110 or individual bits thereof can be interrogated and program branches can be carried out in dependence on the interrogation result.

In order to read out peripheral data, the accumulator 122 of the RSE unit must be loaded with the bit pattern to be read out in this particular program. Accordingly, the program contains a peripheral read-out instruction which transfers the data from accumulator 122 of the RSE unit into the read-out register 143 or 151 and 152 of the addressed peripheral module. All flip-flops in this read-out register which have thus been set to 1 make the MOS driver conductive and produce 0 volt at the read-out contacts. All MOS drivers whose associated flip-flops are set to zero remain blocked, however.

Contacts used for read-out must be provided with an external load resistance (not shown) connected to a source of negative potential. Through this resistance the series-connected peripheral unit receives negative potential as long as the internal MOS drivers are blocked.

A contact can also be programmed to be used selectively for input and output, i.e. for bidirectional operation. For example, two systems of the type shown in FIG. 1 may be connected together via peripheral contacts (e.g. contacts 19 of chip 3). Then peripheral data are read out under control of a peripheral read-out instruction contained in the program which sets the read-out register flip-flops in chip 3 — depending on the information contained in the accumulator of the RSE unit 1. The information is present at the peripheral contacts and can be transferred by the second coupled system via the input path of its peripheral channel. During the transmission of data through the same contact in the opposite direction the second system furnishes the data through the output path of the peripheral channel which data are now likewise transferred, through the input path of the first system, e.g. 22, 31, 30 and 33 of FIG. 2, controlled by a peripheral input instruction from the microprogram at input 32 to the accumulator of the RSE unit. Before carrying out the write-in instruction, however, it must be assured that the associated read-out flip-flop is in the zero state in order to preclude an influence on the input information. This is done by a peripheral read-out instruction which carries the information zero at the appropriate bit locations.

The following Table shows a combination of the control signals which can be transmitted by the RSE unit of FIG. 3 to the chips connected thereto via the module bus, e.g. PSE of FIG. 4, through the four lines of the control bus 118. The right-hand column shows the functions which are performed if a peripheral channel is addressed.

| Control Signal I | II | III | IV | Functions Performed When a Peripheral Channel is Addressed |
|---|---|---|---|---|
| 0 | 0 | 0 | 0 | Input |
| 0 | 0 | 0 | 1 | Input |
| 0 | 0 | 1 | 0 | Input |
| 0 | 0 | 1 | 1 | Input |
| 0 | 1 | 0 | 0 | No Operation |
| 0 | 1 | 0 | 1 | No Operation |
| 0 | 1 | 1 | 0 | No Operation |
| 0 | 1 | 1 | 1 | No Operation |
| 1 | 0 | 0 | 0 | Output |
| 1 | 0 | 0 | 1 | Output |
| 1 | 0 | 1 | 0 | Output |
| 1 | 0 | 1 | 1 | Output |
| 1 | 1 | 0 | 0 | No Operation |
| 1 | 1 | 0 | 1 | No Operation |
| 1 | 1 | 1 | 0 | No Operation |
| 1 | 1 | 1 | 1 | No Operation |

The signal combinations of course also produce other functions if another module instead of the peripheral channel is addressed, which is of course not of interest for the present invention and will therefore not be listed here.

The following Tables show instruction sequences for the peripheral control, the first table illustrating data output and the second table illustrating data input via the same peripheral channel. As an example, the binary value 10001010 is initially to be read out via the eight contacts of the peripheral channel and then the binary value 00100011 is to be fed in. It is also assumed that the module containing the peripheral channel to be activated has the address 62.

Data Output (binary value 10001010)

| Program Step | Contents of RSE Accumulator (122, Figure 3) | Contents of Read-Out Register of Module 62 (151, Figure 4) |
|---|---|---|
| | | 00000000 |
| Load Accumulator with 10001010 | 10001010 | 00000000 |
| Peripheral Read-Out Instruction to Module 62 | 10001010 | 10001010 |

Data Input (binary value 00100011)

| Program Step | Contents of RSE Accumulator (122, Figure 3) | Contents of Read-Out Register of Module 62 (151, Figure 4) |
|---|---|---|
| Load Accumulator with 00000000 | 00000000 | 10001010 |
| Peripheral Read-Out Instruction to Module 62 (set back) | 00000000 | 00000000 |
| Peripheral Input Instruction to Module 62 | 00100011 | 00000000 |

The ROM mask fabrication with a program mask does not require a special modification of existing techniques; rather the gate oxide mask is modified during the normal MOS production process.

The production of highly integrated MOS chips is described in 1. the text by Dietrich Becker and Heinz Mäder, "Hochintegrierte MOS-Schaltungen" [Highly Integrated MOS Circuits], 1972, published by Berliner Union GmbH, Stuttgart, Germany;

2. SGS MOS Technologies, February 1972, published by Olympia Werke;

3. SGS MOS; An Introduction, November 1971, published by Olympia Werke.

The microprogram which controls the peripheral contacts can principally be contained in every chip of a system which contains an ROM which is programmed by a change in the mask during a normal MOS production process. Since the controlling of the peripheral contacts is effected by the RSE unit, it does not matter whether the microprogram is disposed on the same chip as the controlled contact or on another chip.

It will be understood that the above description of the present invention is susceptible to various modifications, changes and adaptations, and the same are intended to be comprehended within the meaning and range of equivalents of the appended claims.

We claim:

1. In a circuit arrangement of at least one highly integrated chip for a microprogrammed data processing device associated with peripheral units, the chip containing circuit components, the arrangement further including connecting contacts on the chip connecting circuit components thereon to the peripheral units for transfer of signals therebetween, the improvement comprising selecting means connected to said contacts for connecting each said contact to constitute either an input or an output terminal under the control of the microprogram contained in the ROM, said selecting means including, for each said connecting contact: a bistable circuit on the chip on which its respective contact is located and having an output in signal transmitting communication with said connecting contact such that a signal corresponding to the logic state of said bistable circuit is continually applied to said connecting contact, said bistable circuit being connected to be set and reset by the microprogram for maintaining said bistable circuit in a selected logic state when said contact constitutes an input terminal and controlling the logic state of said bistable circuit in accordance with signals produced by at least one circuit component on said chip when said contact constitutes an output terminal; and a gating circuit having a signal input in signal receiving communication with said connecting contact and a gating input connected to be controlled by the microprogram for causing said gating circuit to transmit signals present at its said signal input when said contact constitutes an input terminal and to block transmission of signals present at said signal input when said contact constitutes an output terminal.

2. Circuit arrangement as defined in claim 1 wherein said selecting means further comprises an output driver having an input connected to the output of said bistable circuit and an output connected to the signal input of said gating circuit for applying to said signal input a signal corresponding to the logic state of said bistable circuit and wherein said connecting contact is connected to said signal input of said gating circuit and to said output of said driver.

3. Circuit arrangement as defined in claim 1 wherein said bistable circuit has a bit transmission control input connected to receive a train of clock pulses for synchronizing switching of the logic state of said bistable circuit.

* * * * *